US006586122B2

(12) United States Patent
Ishikawa et al.

(10) Patent No.: US 6,586,122 B2
(45) Date of Patent: Jul. 1, 2003

(54) MULTILAYER-COATED CUTTING TOOL

(75) Inventors: Takeshi Ishikawa, Chiba-ken (JP); Nobuhiko Shima, Chiba-ken (JP)

(73) Assignee: Hitachi Tool Engineering, Ltd., Tokyo (JP)

( * ) Notice: Subject to any disclaimer, the term of this patent is extended or adjusted under 35 U.S.C. 154(b) by 0 days.

(21) Appl. No.: 09/903,561

(22) Filed: Jul. 13, 2001

(65) Prior Publication Data
US 2002/0039670 A1 Apr. 4, 2002

(30) Foreign Application Priority Data
Jul. 13, 2000 (JP) ......................................... 2000-213536

(51) Int. Cl.[7] .............................. B23B 27/14; B32B 9/00
(52) U.S. Cl. ............................ 428/698; 51/307; 51/309; 428/212; 428/323; 428/325; 428/697; 428/699; 428/701
(58) Field of Search ................................ 428/325, 323, 428/698, 699, 697, 701, 702, 212; 51/307, 309

(56) References Cited

U.S. PATENT DOCUMENTS 5,182,238 A * 1/1993 Holleck
5,580,653 A * 12/1996 Tanaka et al.
5,882,778 A * 3/1999 Sugizaki et al.
6,231,969 B1 * 5/2001 Knight et al.

FOREIGN PATENT DOCUMENTS

| JP | 07-310174 | 11/1995 | ........... C23C/14/06 |
| JP | 08-118106 | 5/1996 | ........... B23B/27/14 |
| JP | 09-011004 | 1/1997 | ........... B23B/27/14 |

* cited by examiner

*Primary Examiner*—Archene Turner
(74) *Attorney, Agent, or Firm*—Sughrue Mion, PLLC

(57) ABSTRACT

A multilayer-coated cutting tool comprising a cutting tool substrate, and a multilayer coating film comprising a first hard coating film formed on the substrate and a second hard coating film formed on the first hard coating film, the first hard coating film comprising one or more metallic elements selected from the group consisting of Ti, Al and Cr, and one or more non-metallic elements selected from the group consisting of N, B, C and O; and the second hard coating film comprising Si and one or more metallic elements selected from the group consisting of metallic elements of Groups 4a, 5a and 6a of the Periodic Table and Al, and one or more non-metallic elements selected from the group consisting of N, B, C and O; the second hard coating film being a composition-segregated polycrystalline film comprising a phase having a relatively high Si concentration and a phase having a relatively low Si concentration.

16 Claims, 4 Drawing Sheets

MULTILAYER-COATED CUTTING TOOL

FIELD OF THE INVENTION

The present invention relates to a multilayer-coated cutting tool used for cutting metallic materials, etc., particularly to a multilayer-coated cutting tool with improved wear resistance and oxidation resistance.

PRIOR ART

Due to an increasing demand for a higher efficiency of cutting, high-speed machining centers have come into wide use, resulting in a trend of a higher cutting speed. According to this trend, it has become common to coat cutting tools with TiAlN having an improved oxidation resistance in place of TiN and TiCN.

To cope with further increase in the speed of the cutting operations, various improvements are proposed on the coatings of cutting tools. For instance, Japanese Patent 2,793,773 proposes the addition of Si to a TiAlN coating film to improve its oxidation resistance, and Japanese Unexamined Patent Publication Nos. 8-118106 and 9-11004 propose the addition of Si to a Ti-based coating film.

However, the mere addition of Si to the conventional coating film of TiAlN can improve oxidation resistance at most less than 1.2 times, failing to meet the present demand of higher cutting speed, though it produces some effects for a general cutting purpose. Further, though the addition of Si to a Ti-based hard coating film can slightly improve its oxidation resistance, it cannot sufficiently improve a static wear resistance of the coating film, resulting in a coated cutting tool not showing a sufficient improvement. This appears to be caused by the fact that Si added to the coating film forms a simple hard solid solution phase in which Si atoms substitute for Ti atoms to provide only solid-solution strengthening.

Further, the coating film simply containing Si is more brittle by remarkably large compressive stress than a coating film containing no Si, and this excessive compressive stress makes the coating film prone to peel off from the cutting tool substrate immediately after the coating film is formed. Accordingly, the Si-containing coating films have not practically been applied to the cutting tools so far. As works become harder and the cutting conditions become severer, abnormal wear and fracture are caused by the peeling and oxidation of the coating film, resulting in failure to use cutting tools with Si-containing coating films for practical applications. Thus, sufficient improvement has not been achieved so far in the coating films of cutting tools to provide cutting performance necessary for high-speed cutting operations.

OBJECT OF THE INVENTION

Accordingly, an object of the present invention is to provide a cutting tool with an Si-containing coating film having drastically improved wear resistance and oxidation resistance without sacrificing adhesion to the cutting tool substrate, thereby fully exhibiting its own characteristics so that the cutting tool is highly suitable for high-speed cutting operations.

SUMMARY OF THE INVENTION

In view of the fact that an Si-containing coating film formed on a cutting tool substrate has extremely higher compressive stress than a coating film not containing Si, and that the Si-containing coating film sometimes peels off during cutting operations due to an excessive compressive stress, failing to apply the Si-containing coating film to the cutting tool, the Si-containing coating film is desirably used in combination with another hard coating film having excellent adhesion to the substrate. By controlling the structure and crystal form of the Si-containing coating film itself, the residual compressive stress of the Si-containing coating film can be reduced, further improving the adhesion thereof to the cutting tool substrate. Further, by controlling the crystal form of the Si-containing coating film, the hardness of the coating film can be extremely increased, thereby further improving the wear resistance of the coated cutting tool. It has also been found that the oxidation resistance of the Si-containing coating film can be remarkably improved by controlling the crystal form thereof.

Most of presently available multi-element nitrides such as TiAlN or the like form nitrides having a cubic NaCl-type crystal structure, and when Si is added to TiAlN, Si substitutes for a Ti atom in TiAlN to generate a lattice strain owing to a difference in an atom radius between Si and Ti, resulting in increase in a residual compressive stress. As the amount of Si added increases, the compressive stress excessively increases. It has thus been impossible to add Si to multi-element nitrides such as TiAlN, to such an extent that Si can provide sufficient effects.

As a result of research in view of the above problems, the inventors have found that the Si-containing coating film comprising Si and one or more metallic elements of Groups 4a, 5a and 6a and Al can be provided with reduced stress and improved wear resistance as well as improved adhesion to the cutting tool substrate, by making the Si-containing coating film have a structure in which Si-rich, hard crystal grains are dispersed in a matrix constituted by a phase containing a relatively small amount of Si and having a small compressive stress.

Thus, the multilayer-coated cutting tool according to the present invention comprises a cutting tool substrate, and a multilayer coating film comprising a first hard coating film formed on the substrate and a second hard coating film formed on the first hard coating film, the first hard coating film comprising one or more metallic elements selected from the group consisting of Ti, Al and Cr, and one or more non-metallic elements selected from the group consisting of N, B, C and O; and the second hard coating film comprising Si and one or more metallic elements selected from the group consisting of metallic elements of Groups 4a, 5a and 6a of the Periodic Table and Al, and one or more non-metallic elements selected from the group consisting of N, B, C and O; the second hard coating film being a composition-segregated polycrystalline film comprising a phase having a relatively high Si concentration and a phase having a relatively low Si concentration.

The second hard coating film preferably has an average grain size of not more than 50 nm. In the second hard coating film, the phase having a relatively high Si concentration constitutes an amorphous or microcrystalline phase. The second hard coating film preferably comprises $Si_3N_4$ and/or Si as a single phase.

In one embodiment, the second hard coating film preferably contains a combination of Cr and Si or a combination of Ti and Si as metallic elements.

In a further embodiment, the second hard coating film contains boron in the form of a boron nitride. In a still further embodiment, the second hard coating film is a multilayer coating film comprising at least two or more of a CrSiN layer, a $(CrSi)_2N$ layer, a CrSiBN layer, and a $(CrSi)_2BN$ layer.

In a still further embodiment, the first hard coating film preferably contains a combination of Ti and Al or a combination of Cr and Al as metallic elements.

In a still further embodiment, the first hard coating film comprises Al partially replaced by at least one element selected from the group consisting of Si, Mg, Ca, Sr, Li, K and Y in a range of 0.5 atomic % to 30 atomic %.

In a still further embodiment, both the first and second hard coating films are formed by an arc discharge ion-plating method. Both the first and second hard coating films inevitably contain a plurality of droplet particles.

The cutting tool substrate may be an end mill or an insert of cemented carbide.

DESCRIPTION OF THE PREFERRED EMBODIMENTS

Figure 1:
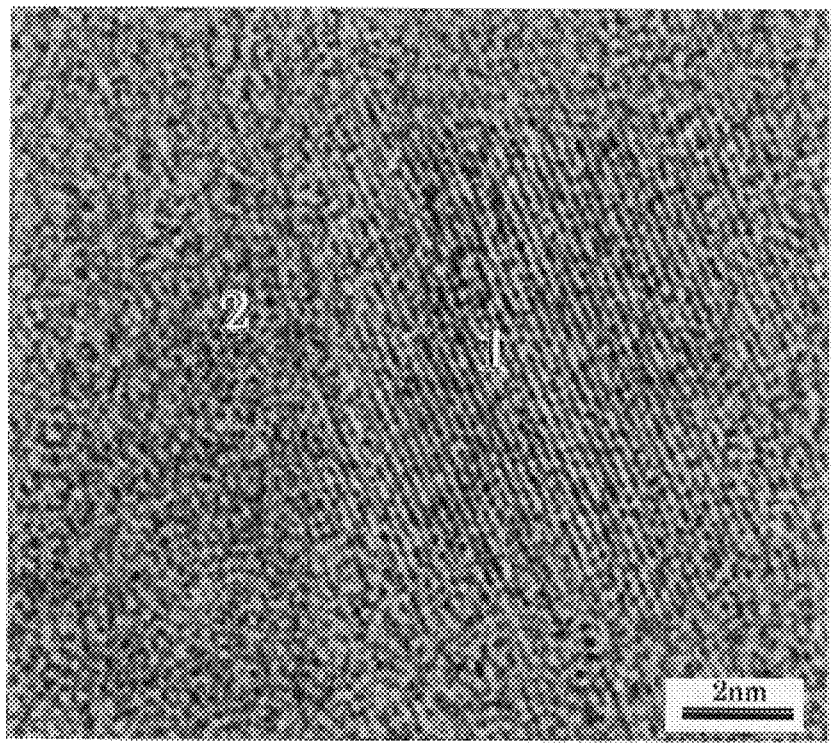
FIG. 1 is a transmission electron photomicrograph showing a lattice image of an Si-containing coating film having a composition of TiSiN in accordance with the present invention.

The multilayer-coated cutting tool of the present invention comprises a multilayer coating film having a first hard coating film formed on the cutting tool substrate and based on Ti, Al and/or Cr as metallic elements, and N, B, C and/or O as non-metallic elements, and a second hard coating film formed on the first hard coating film and based on Si and other metallic elements and N, B, C and/or O as non-metallic elements. The important feature of the present invention is that the second hard coating film is a composition-segregated polycrystalline film comprising a phase having a relatively high Si concentration and a phase having a relatively low Si concentration. The second hard coating film may be called "Si-containing coating film," because it is characterized by the inclusion of Si.

The Si-containing coating film having different phases containing different amounts of Si can be formed not by conventional coating methods but by methods of sequentially or periodically changing ion energy during coating operations. Such methods include, for example, a method in which bias pulse voltage applied to the cutting tool substrate is sequentially or periodically changed between positive voltage and negative voltage during coating operations, and a method in which pulse bias voltage is changed similarly. The positive pulse voltage and the negative pulse voltage are alternating, and their levels and terms are changed depending on the desired composition of the Si-containing coating film. The sequential or periodic change of ion energy changes the diffusion depth of ions on a surface of the cutting tool substrate, to generate unevenness in the concentration of Si. A coating temperature is also an important factor controlling the diffusion depth of ions and thus controlling the crystal form, particularly grain size, of the Si-containing coating film.

The lower the coating temperature, the finer the resultant crystal grains, increasing the hardness of the Si-containing coating film and making grain boundaries denser, thereby preventing the oxidation of the Si-containing coating film due to the diffusion of oxygen in the grain boundaries to improve the oxidation resistance of the Si-containing coating film. Specifically, the phase having a relatively high Si concentration is formed by a low-temperature ion plating as an amorphous or microcrystalline phase in the Si-containing coating film. This high-Si-concentration phase preferably comprises nanometer-size crystal grains having an average grain size of not more than 50 nm, which provide particularly excellent effects of improving oxidation resistance. The crystal grains of the high-Si-concentration phase are so small that the high-Si-concentration phase may be called "amorphous or microcrystalline."

Si-rich crystal grains are turned to an amorphous or microcrystalline phase at a coating temperature of 350° C. to 400° C., resulting in a structure having remarkably decreased lattice defects by good arrangement of a crystalline phase with an amorphous or microcrystalline phase, further reducing the diffusion of oxygen. This further improves the oxidation resistance of the Si-containing coating film and makes the grain size finer to increase the hardness of the coating film, resulting in forming a coating film capable of providing a cutting tool with sufficient cutting performance. Since the Si content is relatively small in the matrix phase (low-Si-concentration phase), the Si-containing coating film has good adhesion to the underlying hard coating film.

An $Si_3N_4$ phase and/or an Si phase exists in the Si-containing coating film formed at a coating temperature of 300° C. to 350° C. The existence of these phases can be confirmed by examining by ESCA whether or not there is a peak in its binding energy. In a case where the $Si_3N_4$ phase and the Si phase exist in the coating film, the coating film tends to be provided with increased hardness and wear resistance because of the lattice strain caused by these phases. However, the Si-containing coating film having lattice strain tends to have slightly decreased oxidation resistance presumably due to the fact that the diffusion of oxygen is accelerated through the grain boundaries.

What is important in the Si-containing coating film is its structure and crystal form, but not the types of other components than Si. That is, various elements can be combined with Si. The inventors' research has revealed that the second hard coating film containing Ti and Si as metallic elements shows the most excellent dynamic oxidation resistance in cutting operations. In this case, titanium oxide having a lower free energy of formation than a silicon oxide is formed in a surface of the Si-containing coating film during the cutting operations, so that Ti is diffused outward in the Si-containing coating film to form a powdery TiO layer in a surface area of the Si-containing coating film, while Si in the surface is diffused inward to form an extremely dense silicon oxide layer directly under the TiO layer. Why the coating film shows excellent dynamic oxidation resistance is presumably due to the fact that the powdery TiO contributes to lubrication, and that a dense Si oxide layer has excellent adhesion to an underlying layer and functions as a barrier to the diffusion of oxygen. Because the dynamic oxidation resistance is particularly important in the high-speed cutting of high-hardness steel, the coating film containing Ti and Si achieves the longest life.

In a case where the Si-containing coating film contains Cr and Si as metallic elements, the self-lubrication effect of Cr remarkably suppresses galling at cutting edges at the time of cutting steel, etc., thereby providing a work with an excellent machined surface. Particularly in the case of cutting carbon steel prone to be subjected to galling, this coating film achieves the best-machined surface and the longest life. It is also confirmed that a $(CrSi)_2N$ layer is smaller than a CrSiN layer in a friction coefficient to carbon steel, and that the adoption of the $(CrSi)_2N$ layer can therefore further suppress the galling to elongate the life of the cutting tool.

Although the Si-containing coating film can be provided with reduced internal stress by controlling the structure and crystal form, a single-layer, Si-containing coating film tends to peel off from the cutting tool substrate, when it is subjected to heavy cutting operations. Therefore, the Si-containing coating film should have an underlying coating film (first hard coating film) having excellent adhesion to the cutting tool substrate. Although the composition of this adhesion-providing underlying layer is not restrictive as long as it comprises one or more metallic elements selected from the group consisting of Ti, Al and Cr, and one or more non-metallic elements selected from the group consisting of N, B, C and O, a hard TiAl-based coating film or a hard CrAl-based coating film are preferable, because they can improve the high-speed cutting performance of the cutting tool to high-hardness steel than the Ti-based coating film. The Ti-based coating film can provide a particularly stable cutting performance in heavy cutting operations.

Of course, in the first hard coating film, Ti may be partially replaced by the elements of Groups 4a, 5a and 6a of the Periodic Table, as is generally practiced. Moreover, the replacement of Ti by Si, Mg, Ca, Sr, Li, K and Y in a range of 0.5 atomic % to 30 atomic % can extremely elongate the life. Like the phenomenon described above, these elements diffuse in the coating film toward the surface to form oxides during cutting operations, and the oxides of these elements have particularly low melting points, thereby forming a liquid phase during cutting to remarkably reduce cutting resistance and temperature, resulting in providing a lubrication effect and thus achieving a long life. The replacement of Ti by Si enhances the oxidation resistance of the coating film, thereby achieving a longer life at the time of cutting high-hardness materials at high-cutting speeds. When the second hard coating film contains Si, Si may be segregated or dissolved in a solid solution under other general coating conditions than that for the formation of the first hard coating film.

The addition of boron to the first hard coating film and/or the second hard coating film is effective to improve a cutting performance. Particularly in a case where the coating film is formed under high ion energy conditions, boron exists as BN in the coating film, improving the self-lubrication of the coating film to reduce cutting resistance, resulting in achieving a long life. The existence of a BN phase can be confirmed by ESCA.

With this structure, the multilayer-coated cutting tool of the present invention has extremely improved cutting performance, because its multilayer coating film is provided with improved oxidation resistance and hardness without peeling off from the cutting tool substrate, even under severe cutting conditions such as cutting at high speeds and high-hardness materials.

Figure 2:
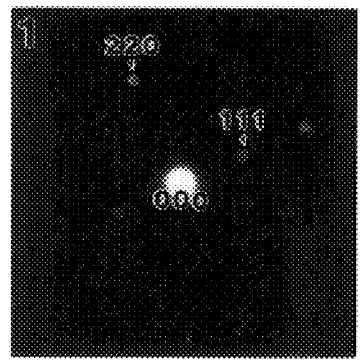
FIG. 2 is a microscopic electron beam diffraction image showing a crystal structure of a high-Si-concentration phase in FIG. 1.
Figure 3:
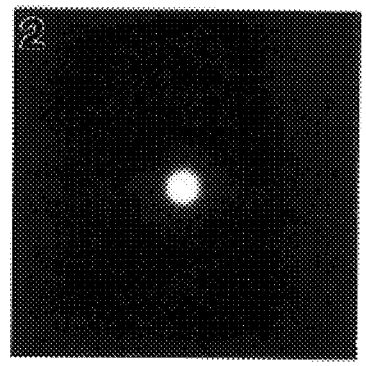
FIG. 3 is a microscopic electron beam diffraction image showing a crystal structure of a low-Si concentration phase in FIG. 1.

Taking an amorphous or microcrystalline phase in a TiSiN coating film as a second hard coating film for example, the requirements of the present invention will be described in detail. The composition of TiSiN and the formation method of the TiSiN coating film are the same as in EXAMPLE 4. The transmission electron photomicrograph of the TiSiN coating film is shown in FIG. 1. FIGS. 2 and 3 show the electron beam diffraction photomicrographs of crystal structures in regions 1 and 2 in FIG. 1 taken under the conditions of a camera length of 50 cm and a beam diameter of 2 nm to 5 nm.

Figure 4:
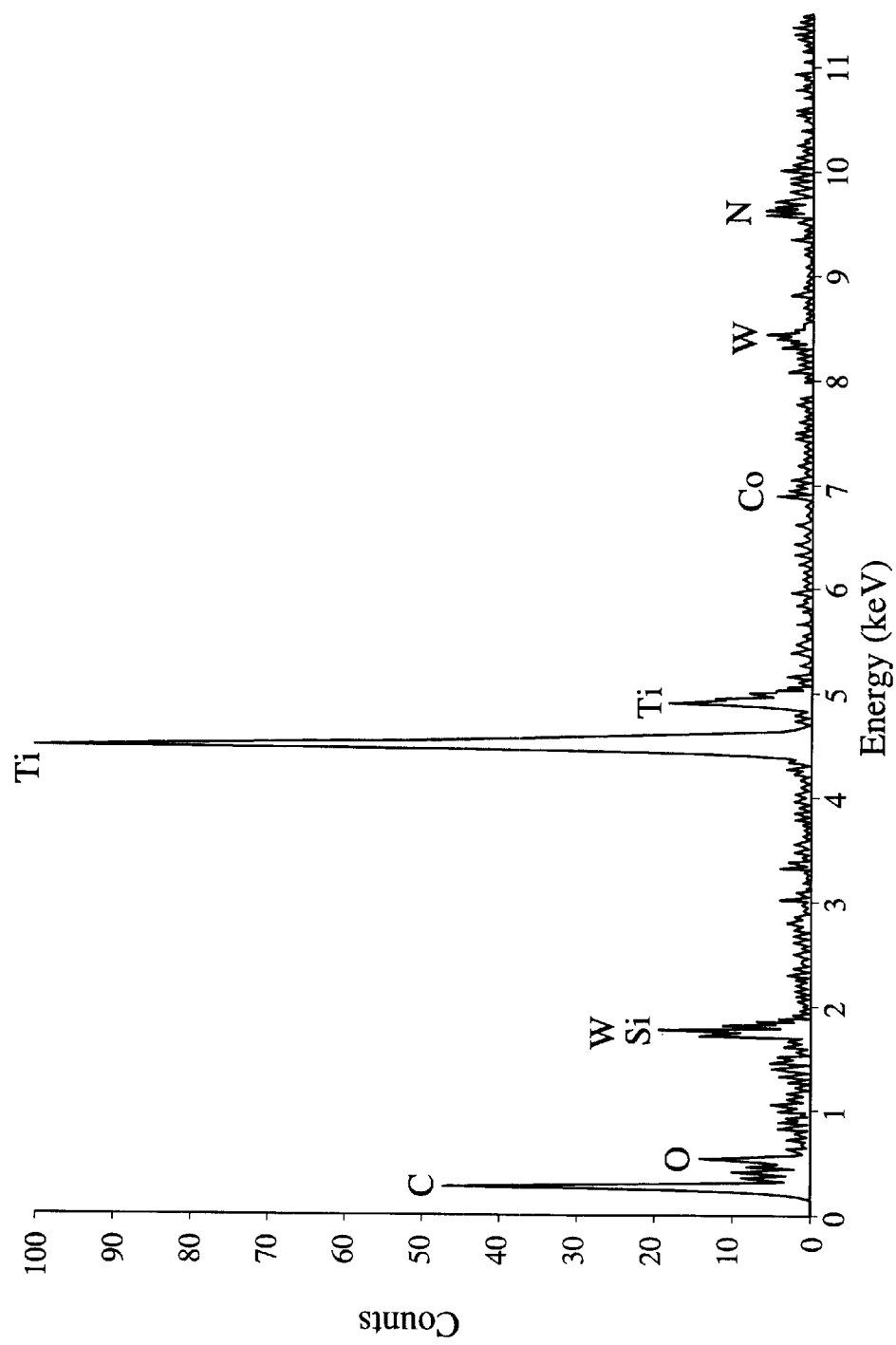
FIG. 4 shows the energy dispersion-type, quantitative analysis results of an amorphous or microcrystalline phase in the Si-containing coating film of FIG. 1.
Figure 5:
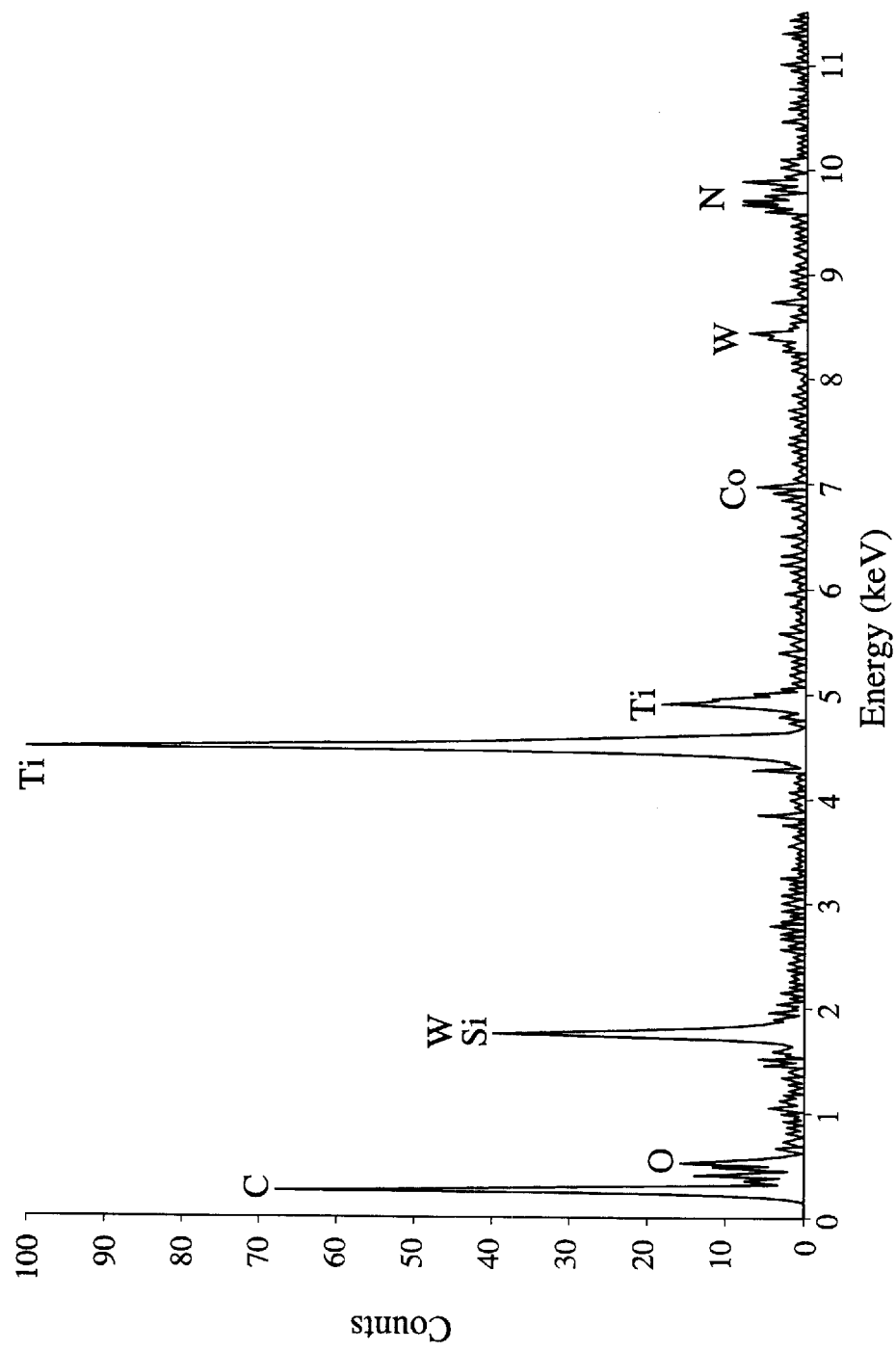
FIG. 5 shows the energy dispersion-type, quantitative analysis results of a crystalline phase in the Si-containing coating film of FIG. 1.

It is clear from FIGS. 1–3 that the Si-containing coating film of the present invention has a crystalline phase and an amorphous or microcrystalline phase. FIGS. 4 and 5 show the energy-dispersive, quantitative analysis results of the regions 1 and 2 in FIG. 1. The quantitative analysis of each region was conducted in a 1-nm-square region. FIGS. 4 and 5 show that the crystalline region 1 contains 8 atomic % of Si, while the amorphous or microcrystalline phase 2 contains 26 atomic % of Si, both based on the metallic elements. It is thus clear from FIGS. 4 and 5 that the concentration of Si in the amorphous or microcrystalline phase 2 is as high as three times or more that in the matrix crystalline phase 1 in this sample, meaning that Si exists predominantly in the amorphous or microcrystalline phase 2.

Figure 6:
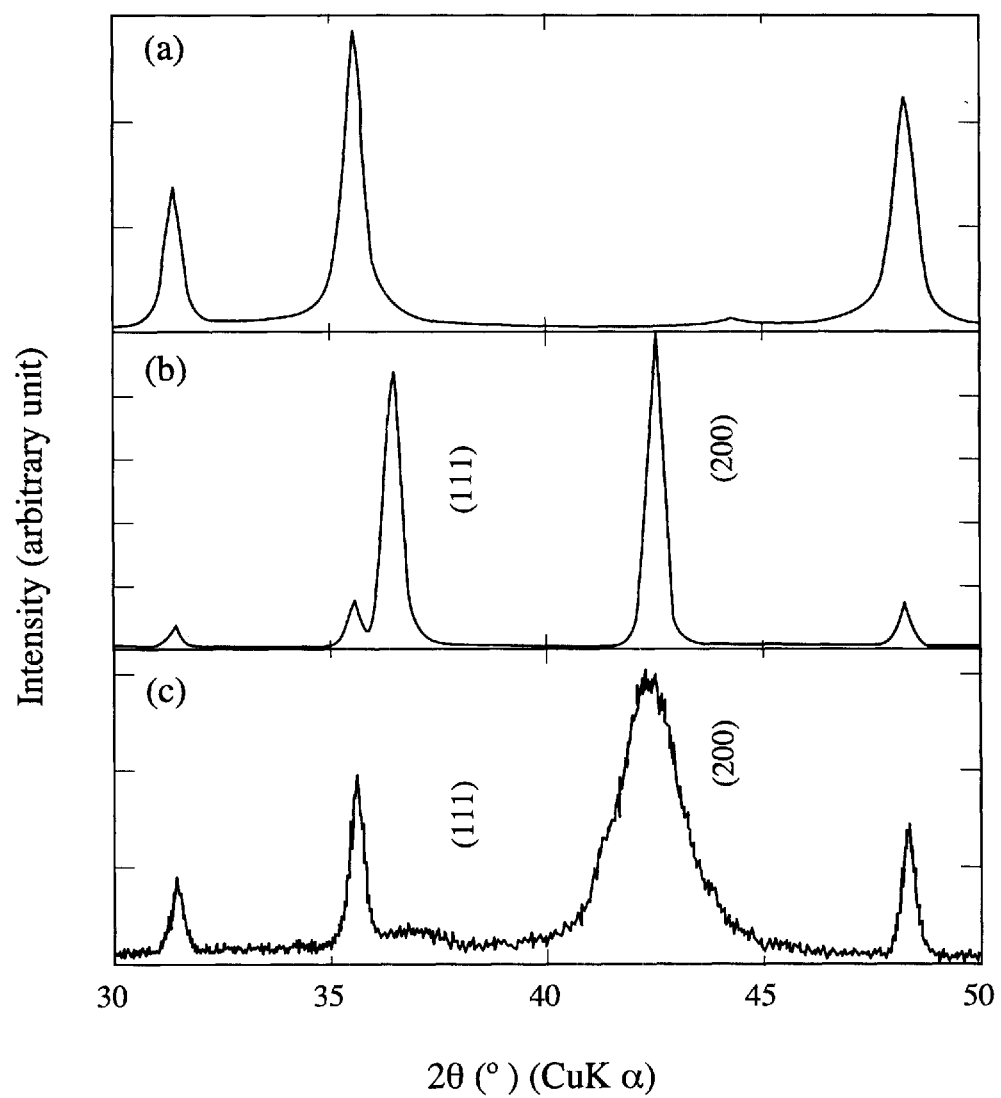
FIG. 6 is a graph showing X-ray diffraction patterns of (a) a cutting tool substrate of cemented carbide, (b) an Si-containing coating film of TiSiN produced by a conventional method, and (c) an Si-containing coating film of TiSiN produced by the method of the present invention.

FIG. 6 shows X-ray diffraction patterns of a TiSiN coating film (b) formed in COMPARATIVE EXAMPLE 5, and the above TiSiN coating film (c) formed by the method of the present invention (EXAMPLE 4), respectively. The method of forming the TiSiN coating film (b) in COMPARATIVE EXAMPLE 5 is described in "Surface and Coating Technology," 133–134(2000), pp. 307–313. Incidentally, (a) in FIG. 6 shows an X-ray diffraction pattern of a cutting tool substrate of cemented carbide. It is clear from FIG. 6 that a peak at a (200) face in an X-ray diffraction pattern is much broader in the Si-containing coating film (c) of the present invention than in the conventional Si-containing coating film (b).

It is also clear from the electron beam diffraction image of the region 1 in FIG. 1 and the X-ray diffraction pattern (c) shown in FIG. 6 that the crystalline region 1 has an NaCl-type crystal structure having an fcc structure, and that though a diffraction peak at the (200) face is broad by a residual stress in the Si-containing coating film, a face gap does not change largely by the addition of Si. It is thus confirmed from these results that the crystalline region 1 comprises TiSiN, in which a small amount of Si substitutes for Ti. The Si-containing coating film of the present invention preferably has the maximum peak in the intensity of X-ray diffraction at the (200) face, because the Si-containing coating film predominantly oriented in the (200) face has the least lattice defects and thus excellent oxidation resistance.

The Si-containing coating film containing a high-Si-concentration, amorphous or microcrystalline phase and a low-Si-concentration, crystalline phase can be formed from Si, one or more metallic elements selected from the group consisting of the metallic elements of Groups 4a, 5a and 6a of the Periodic Table and Al, more preferably, one or more metallic elements selected from the group consisting of Si and Ti, Al and Cr; and one or more non-metallic elements selected from the group consisting of N, B, C and O. Even if an extremely small amount of Si is contained in the Si-containing coating film, an Si-concentrated amorphous or microcrystalline phase can be dispersed in the Si-containing coating film.

In a preferred embodiment, an area ratio of the high-Si-concentration, amorphous or microcrystalline phase to the low-Si-concentration, crystalline phase is 5:95 to 50:50 in a transmission electron photomicrograph of the Si-containing coating film. In the high-Si-concentration, amorphous or microcrystalline phase, the concentration of Si is preferably 5 to 40 atomic %, more preferably 10 to 20 atomic % based on the total amount of the metalloid elements.

With the Si-containing coating film having a high-Si-concentration, amorphous or microcrystalline phase and a low-Si-concentration, crystalline phase, the cutting tool can exhibit stable cutting performance. With respect to a static oxidation mechanism, an extremely fine Si oxide is formed from Si predominantly concentrated in the high-Si-concentration, amorphous or microcrystalline phase. The fine silicon oxide functions as a barrier to the inward diffusion of oxygen, thereby contributing to a significant improvement in oxidation resistance. Further, the Si-containing coating film with a structure having a high-Si-concentration, amorphous or microcrystalline phase and a low-Si-concentration, crystalline phase, both having the same elements, has less lattice defects in boundaries therebetween than a coating film having an independent phase such as silicon nitride, etc. As a result, the former is better than the latter in preventing the inward diffusion of oxygen.

As a result of analysis of dynamic oxidation, namely an oxidation behavior in cutting operations, it has been found that a surface portion of the Si-containing coating film of the cutting tool is turned to an Si-concentrated oxide film with Fe deposited under wearing action during the cutting operations, and that the resultant Si-concentrated oxide film prevents oxidation while exhibiting a lubrication effect. It is presumed that these synergy effects remarkably improve high-speed cutting performance of the cutting tool.

To carry out coating of the cutting tool, it is desirable to use an arc discharge ion-plating method that can form a coating film with a remaining compressive stress at a relatively low temperature, from the viewpoint of a thermal influence on the cutting tool substrate, the fatigue strength of the cutting tool, the adhesion of a coating film to the cutting tool, etc.

The arc discharge ion-plating method for forming the Si-containing coating film having a high-Si-concentration, amorphous or microcrystalline phase and a low-Si-concentration, crystalline phase on the cutting tool substrate via the first hard coating film may be carried out, for instance, as follows: First, a furnace is evacuated to vacuum of $3 \times 10^{-5}$ Pa, and the cutting tool substrate is heated with a heater. After the cutting tool substrate is cleaned and activated by Ar ions, an alloy target for an aimed coating film composition is placed on a plurality of cathodes as evaporation sources for arc discharge in the furnace, and ionized by arc discharge to generate an atmosphere containing various kinds of metal ions and a reaction gas such as nitrogen, in which the cutting tool substrate is ion-plated. In this case, it is necessary to periodically change a bias voltage applied to the cutting tool substrate to control ion energy at the time of forming the Si-containing coating film.

More specifically, the level of ion energy for ion plating is determined mainly by a combination of the bias voltage applied to the cutting tool substrate and the reaction gas. The bias voltage applied to the cutting tool substrate may be different levels of negative bias voltage or bias voltage periodically changing between negative and positive. Such bias voltage induces a periodic change in the ion energy in the Si-containing coating film, thereby forming phases of different Si concentrations in the same Si-containing coating film. This periodic change of ion energy is important in the present invention. Various factors such as bias voltage, reaction pressure and temperature, etc. contribute to the periodic change of ion energy.

The difference in the Si concentration in the Si-containing coating film may also change depending on the temperature of the substrate. Specifically, the high-Si-concentration, amorphous or microcrystalline phase would less likely be formed in the Si-containing coating film at temperatures over 500° C., even if other parameters than the temperature were optimized. Because the temperature of the substrate tends to be elevated as the bias voltage increases, a device for cooling the cutting tool substrate may be required when the materials of the cutting tool substrate limit the temperature thereof.

With respect to the first hard coating film, it may be formed by an arc discharge ion-plating method without changing ion energy throughout the process.

Though the coating film of the present invention may be effectively applied to cutting tool substrates of high-speed tool steel, it is particularly effective when applied to end mills and inserts of cemented carbide capable of cutting works at higher speeds.

The present invention will be described in further detail referring to EXAMPLES below without intention of restricting the present invention thereto.

EXAMPLES 1–27

Using various kinds of alloy targets as evaporation sources of elements and $N_2$ as a reaction gas in an arc discharge ion-plating device, the coating films of EXAMPLES 1–27 shown in Table 1 were formed on cutting tool substrates under the following conditions:

| Temperature of substrate: | 350° C. to 540° C.; |
| Pressure of reaction gas: | 5 Pa; |
| Bias pulse voltage: | |
| Negative bias voltage: | 300 V; |
| Positive bias voltage: | 20 V; |
| Term of negative bias voltage: | 80%; |
| Term of positive bias voltage: | 20%; and |
| Frequency of bias voltage: | 15 kHz. |

TABLE 1

| Ex. No. | Si-Containing Coating Film (Second Coating Film) Composition (atomic %) | Av. Grain Size (nm) | First Coating Film Composition (atomic %) | Square End Mill Wear VB (mm) | Milling Insert Cutting Time (hr) |
|---|---|---|---|---|---|
| 1 | $(Cr_{90}Si_{10})N$ | 150 | $(Ti_{50}Al_{50})N$ | 0.05 | 2.2 |
| 2 | $(Cr_{90}Si_{10})N$ | 40 | $(Ti_{50}Al_{50})N$ | 0.02 | 3.5 |
| 3 | $(Cr_{90}Si_{10})N^*$ | 10 | $(Ti_{50}Al_{50})N$ | 0.02 | 4.1 |
| 4 | $(Ti_{75}Si_{25})N$ | 40 | $(Ti_{50}Al_{50})N$ | 0.02 | 2.5 |
| 5 | $(Ti_{85}Si_{15})N$ | 35 | $(Ti_{50}Al_{50})N$ | 0.02 | 2.4 |
| 6 | $(Ti_{85}Si_{15})NO$ | 35 | $(Cr_{50}Al_{50})N$ | 0.02 | 3.0 |
| 7 | $(Ti_{85}Si_{15})N$ | 35 | $(Ti_{46}Al_{50}Mg_4)N$ | 0.01 | 3.6 |
| 8 | $(Ti_{85}Si_{15})BN^*$ | 20 | $(Ti_{42}Al_{45}Mg_{13})N$ | 0.01 | 4.2 |
| 9 | $(Al_{85}Si_{15})N$ | 200 | $(Ti_{50}Al_{50})N$ | 0.05 | 2.4 |
| 10 | $(Al_{70}Si_{30})N$ | 35 | $(Ti_{50}Al_{50})N$ | 0.03 | 2.9 |
| 11 | $(Al_{50}Si_{50})N$ | 35 | $(Ti_{50}Al_{50})N$ | 0.08 | 1.6 |
| 12 | $(Al_{40}Si_{60})N$ | 35 | $(Ti_{50}Al_{50})N$ | 0.08 | 1.4 |
| 13 | $(Ti_{70}Al_{15}Si_{15})N$ | 200 | $(Ti_{50}Al_{50})N$ | 0.04 | 2.1 |

TABLE 1-continued

| Ex. No. | Si-Containing Coating Film (Second Coating Film) Composition (atomic %) | Av. Grain Size (nm) | First Coating Film Composition (atomic %) | Square End Mill Wear VB (mm) | Milling Insert Cutting Time (hr) |
|---|---|---|---|---|---|
| 14 | $(Cr_{78}Al_{10}Si_{12})N$ | 150 | $(Ti_{50}Al_{50})N$ | 0.03 | 2.3 |
| 15 | $(Ti_{85}Nb_{10}Si_5)N$ | 50 | $(Ti_{50}Al_{50})N$ | 0.04 | 2.5 |
| 16 | $(Ti_{80}Al_5Si_{15})N$ | 35 | $(Ti_{50}Al_{50})N$ | 0.05 | 1.9 |
| 17 | $(Cr_{94}Si_5W_1)N$ | 20 | $(Ti_{50}Alhd\ 50)N$ | 0.07 | 1.5 |
| 18 | $(Ti_{85}Si_{10}Y_5)N$ | 20 | $(Ti_{50}Al_{50})N$ | 0.04 | 2.1 |
| 19 | $(Nb_{95}Si_5)N$ | 20 | $(Ti_{50}Al_{50})N$ | 0.05 | 1.9 |
| 20 | $(V_{95}Si_5)N$ | 50 | $(Ti_{50}Al_{50})N$ | 0.05 | 1.9 |
| 21 | $(Zr_{95}Si_5)N$ | 100 | $(Ti_{50}Al_{50})N$ | 0.07 | 1.6 |
| 22 | $(Mo_{95}Si_5)N$ | 100 | $(Ti_{50}Al_{50})N$ | 0.07 | 1.5 |
| 23 | $(Ti_{75}Si_{25})NO$ | 100 | TiN | 0.04 | 2.7 |
| 24 | $(Ti_{75}Si_{25})CN$ | 100 | TiN | 0.03 | 2.3 |
| 25 | $(Cr_{95}Si_5)BN^*$ $(Cr_{95}Si_5)_2BN^*$ | 20 | TiN | 0.02 | 3.5 |
| 26 | $(Cr_{95}Si_5)ON$ | 80 | $(Ti_{50}Al_{50})N$ | 0.09 | 2.3 |
| 27 | $(Cr_{75}Si_{25})BN$ | 80 | $(Ti_{50}Al_{50})N$ | 0.07 | 3.9 |

Note *: Amorphous phase formed at 350° C.

While rotating each substrate at a revolution of 5 m$^{-1}$, electric current of 30 A was applied to each evaporation source arranged on one side, and electric current of 300 A was applied to each evaporation source opposing thereto to form a coating film. Using six-edge square end mills of cemented carbide each having an outer diameter of 8 mm and milling inserts of cemented carbide as cutting tool substrates, a coating film was formed on each substrate in a total thickness of 4 μm to 6 μm. Incidentally, the first hard coating film was formed by a conventional method at a constant bias voltage. Multi-layer coating films were formed together with a TiAlN film, if necessary.

Table 1 shows the composition and average grain size of the Si-containing coating film in each sample. The Si-containing coating film had a microcrystalline structure composed of ultra-fine crystal grains in EXAMPLES except for EXAMPLES 3, 8 and 25.

Though Table 1 does not show atomic ratios of the metallic elements to the non-metallic elements, they are not necessarily 1:1. Table 1 also shows the cutting test results with the coated end mills and the coated milling inserts. With respect to each square end mill, a wear depth of a flank was measured at a cutting length of 200 m. With respect to each insert, a cutting time was measured until it was broken. The cutting conditions were as follows:

For six-edge square end mills of cemented carbide
  Cutting method: side cutting,
  Work: SKD11 (hardness: HRC 52), width 150 mm×length 250 mm,
  Depth of cutting: 8 mm in axial direction, 0.2 mm in radial direction,
  Cutting speed: 500 m/minute,
  Feed: 0.07 mm/edge, and
  Cutting oil: air blowing.
For milling inserts of cemented carbide
  Cutting tool: EDEW15T4TN-15 (JIS B 4120),
  Cutter: 63 mm in diameter,
  Cutting method: chamfering,
  Work: SKD61 (hardness: HRC 43), width 50 mm×length 250 mm,
  Depth of cutting: 2.0 mm,
  Cutting speed: 250 m/minute,
  Feed: 0.5 mm/rev, and
  Cutting oil: air blowing.

Table 1 shows that stable cutting was performed even at a high cutting speed in EXAMPLES 1–27. In EXAMPLES 1 to 3 in which Si was added to Cr to change an average grain size, the finer the average grain size, the higher wear resistance the cutting tools had. In EXAMPLES 4 to 8 in which various amounts of Si was added to Ti, all cutting tools had excellent cutting performance. In EXAMPLES 9 to 12 in which Si was added to Al, all coated cutting tools showed the same wear resistance as those of EXAMPLES 4 to 8 in which Si was added to Ti. The coated cutting tools of EXAMPLES 13 to 18 containing three kinds of elements had excellent cutting performance and similarly good wear resistance.

In EXAMPLES 19 to 22 containing Si and Nb, V, Zr or Mo, all coated cutting tools had excellent cutting performance and similar wear resistance. The coated cutting tools containing O or C in addition to N in EXAMPLES 23 and 24 exhibited the same performance as that of other EXAMPLES. The coated cutting tool of EXAMPLE 25 had a multilayer film of an fcc crystal structure of (CrSi)BN and a hcp crystal structure of (CrSi)$_2$BN with excellent results. The coated cutting tools of EXAMPLES 26 and 27 in which oxygen or boron was added to a CrSiN coating film had better results than the conventional coated cutting tools. In all of EXAMPLES 1–27, a high-Si-concentration, amorphous or microcrystalline phase and a low-Si-concentration, crystalline phase were observed in the Si-containing coating film.

COMPARATIVE EXAMPLES 1–10

After conducting the same pretreatment as in EXAMPLE 1, coating films having compositions shown in Table 2 were formed by a conventional method using targets of various kinds of alloys as evaporation sources of elements and an N$_2$ gas as a reaction gas in the same arc discharge ion-plating device as in EXAMPLE 1 under the following coating conditions:

Temperature of substrate: 400° C.;
Pressure of reaction gas: 5 Pa; and
Negative bias voltage: 70 V.

The amount of Si was 15 atomic % in the coating film, and the coating film was a simple solid solution layer without segregation of Si. A ratio of Ti to Al in the TiAl coating film was 1:1. Cutting performance was evaluated under the same cutting conditions as in EXAMPLES. The evaluation results are shown in Table 2.

TABLE 2

| COM. EX. | Composition | Square End Mill Wear VB (mm) | Milling Insert Cutting Time (hr) |
|---|---|---|---|
| 1 | TiN | 5 m$^{(1)}$ | 0.2 |
| 2 | TiCN | 80 m$^{(2)}$ | 0.6 |
| 3 | TiN—TiAlN | 0.18 | 0.7 |
| 4 | TiAlSiN | 0.15 | 0.7 |
| 5 | TiSiN | Peeled | Broken |
| 6 | TiAlN—TiSiN | 0.14 | 0.9 |
| 7 | TiZrN | Peeled | 0.1 |
| 8 | TiN—AlN Multilayer Film | 0.22 | 0.4 |

TABLE 2-continued

| COM. EX. | Composition | Square End Mill Wear VB (mm) | Milling Insert Cutting Time (hr) |
|---|---|---|---|
| 9 | TiN—CrSiN | 0.34 | 0.6 |
| 10 | CrSiN | Peeled | 0.7 |

Note:
(1)Cutting could not be continued when a cutting length reached 5 m.
(2)Cutting could not be continued when a cutting length reached 80 m.

In COMPARATIVE EXAMPLE 4 in which Si was added to a TiAlN coating film, the addition of Si improved the oxidation resistance and hardness of the coating film, though it increased a compressive stress such that the thickness of the film was at most 2 μm, failing to provide a substantial improvement in the cutting performance of the cutting tool with a TiAlN film. Since the coated cutting tools of COMPARATIVE EXAMPLES 5 and 6 were formed by the conventional method, the segregation of Si and an amorphous or microcrystalline phase were not observed in the coating film. The peeling of the coating film occurred at the initial cutting stage because of remarkable brittleness of Si. The multiple-element coating film containing no Si in COMPARATIVE EXAMPLE 7 had extremely low oxidation resistance, failing to exhibit sufficient cutting performance under sever cutting conditions such as high-speed cutting. COMPARATIVE EXAMPLE 8 also yielded extremely poorer results than EXAMPLES. COMPARATIVE EXAMPLES 9 and 10 provided a CrSi-based simple solid solution layer having much shorter life than those of EXAMPLES.

While the coated cutting tool of the present invention has been described with reference to the preferred embodiments, it should be understood that the present invention is not limited thereto. On the contrary, the present invention is intended to cover all alternatives, modifications and equivalents, which may be included within the spirit and scope of the invention as defined by the appended claims.

As described above in detail, the present invention provides a cutting tool with a coating film having higher hardness than that of the conventional TiAlN coating film made by simply adding Si, thereby exhibiting sufficient cutting performance, particularly excellent oxidation resistance and wear resistance, even in a high-speed cutting operations. Further, the coated cutting tool of the present invention can be satisfactorily used with high performance even under severe cutting conditions such as at high-speed cutting and dry cutting.

What is claimed is:

1. A multilayer-coated cutting tool comprising a cutting tool substrate, and a multilayer coating film comprising a first hard coating film formed on said substrate and a second hard coating film formed on said first hard coating film, said first hard coating film comprising one or more metallic elements selected from the group consisting of Ti, Al and Cr, and one or more non-metallic elements selected from the group consisting of N, B, C and O; and said second hard coating film comprising Si and one or more metallic elements selected from the group consisting of metallic elements of Groups 4a, 5a and 6a of the Periodic Table and Al, and one or more non-metallic elements selected from the group consisting of N, B, C and O; said second hard coating film being a composition-segregated polycrystalline film comprising a phase having a relatively high Si concentration and a phase having a relatively low Si concentration.

2. The multilayer-coated cutting tool according to claim 1, wherein said second hard coating film has an average grain size of not more than 50 nm.

3. The multilayer-coated cutting tool according to claim 1, wherein said phase having a relatively high Si concentration constitutes an amorphous or microcrystalline phase in said second hard coating film.

4. The multilayer-coated cutting tool according to claim 1, wherein said second hard coating film comprises $Si_3N_4$ and/or Si as a single phase.

5. The multilayer-coated cutting tool according to claim 1, wherein said second hard coating film contains Cr and Si as metallic elements.

6. The multilayer-coated cutting tool according to claim 1, wherein said second hard coating film contains Ti and Si as metallic elements.

7. The multilayer-coated cutting tool according to claim 1, wherein said second hard coating film contains boron in the form of a boron nitride.

8. The multilayer-coated cutting tool according to claim 1, wherein said second hard coating film is a multilayer coating film comprising at least two or more of a CrSiN layer, a $(CrSi)_2N$ layer, a CrSiBN layer, and a $(CrSi)_2BN$ layer.

9. The multilayer-coated cutting tool according to claim 1, wherein said first hard coating film contains Ti and Al as metallic elements.

10. The multilayer-coated cutting tool according to claim 1, wherein said first hard coating film contains Cr and Al as metallic elements.

11. The multilayer-coated cutting tool according to claim 1, wherein said first hard coating film comprises Al partially replaced by at least one element selected from the group consisting of Si, Mg, Ca, Sr, Li, K and Y in a range of 0.5 atomic % to 30 atomic %.

12. The multilayer-coated cutting tool according to claim 1, wherein both of said first and second hard coating films are formed by an arc discharge ion-plating method.

13. The multilayer-coated cutting tool according to claim 12, wherein both of said first and second hard coating films inevitably contain droplet particles.

14. The multilayer-coated cutting tool according to claim 1, wherein said cutting tool substrate is an end mill of cemented carbide.

15. The multilayer-coated cutting tool according to claim 1, wherein said cutting tool substrate is an insert of cemented carbide.

16. The multilayer-coated cutting tool according to claim 2, wherein said phase having a relatively high Si concentration constitutes an amorphous or microcrystalline phase in said second hard coating film.

* * * * *